United States Patent
Fan et al.

(10) Patent No.: US 11,063,126 B2
(45) Date of Patent: Jul. 13, 2021

(54) METAL CONTACT ISOLATION FOR SEMICONDUCTOR STRUCTURES

(71) Applicant: International Business Machines Corporation, Armonk, NY (US)

(72) Inventors: Su Chen Fan, Cohoes, NY (US); Yann Mignot, Slingerlands, NY (US); Hsueh-Chung Chen, Cohoes, NY (US); James J. Kelly, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/288,741

(22) Filed: Feb. 28, 2019

(65) Prior Publication Data
US 2020/0279925 A1   Sep. 3, 2020

(51) Int. Cl.
*H01L 29/76*   (2006.01)
*H01L 29/40*   (2006.01)
*H01L 29/417*   (2006.01)
*H01L 27/088*  (2006.01)
*H01L 21/8234* (2006.01)

(52) U.S. Cl.
CPC ...... *H01L 29/401* (2013.01); *H01L 29/41741* (2013.01); *H01L 21/823475* (2013.01); *H01L 27/088* (2013.01)

(58) Field of Classification Search
CPC ............. H01L 29/401; H01L 29/41741; H01L 21/823864; H01L 21/823475; H01L 27/088
USPC ....................................................... 257/213
See application file for complete search history.

(56) References Cited

U.S. PATENT DOCUMENTS

| | | |
|---|---|---|
| 7,084,060 B1 | 8/2006 | Furukawa et al. |
| 9,627,511 B1 | 4/2017 | Cheng et al. |
| 9,741,626 B1 | 8/2017 | Cheng et al. |
| 9,761,694 B2 | 9/2017 | Cheng et al. |
| 9,859,388 B1 | 1/2018 | Cheng et al. |

(Continued)

OTHER PUBLICATIONS

R.H.A. Ras et al., "Blocking the Lateral Film Growth at the Nanoscale in Area-Selective Atomic Layer Deposition," Journal of American Chemical Society, Aug. 27, 2008, pp. 11252-11253, vol. 130, No. 34.

(Continued)

*Primary Examiner* — Calvin Y Choi
(74) *Attorney, Agent, or Firm* — Erik Johnson; Ryan, Mason & Lewis, LLP

(57) ABSTRACT

A method of forming a semiconductor structure includes the following steps. At least a first source/drain region and a second source/drain region are formed in a substrate. At least a first sacrificial layer and a second sacrificial layer are respectively formed over the first source/drain region and the second source/drain region. A spacer layer is formed on at least a top surface of the substrate and around sides of the first sacrificial layer and the second sacrificial layer. The spacer layer includes an electrical-isolating material. The first sacrificial layer and a second sacrificial layer are removed to form a first open trench and a second open trench. The first open trench and the second open trench are filled with metal contact material to form a first metal contact and a second metal contact electrically isolated from each other by the spacer layer.

20 Claims, 5 Drawing Sheets

(56) References Cited

U.S. PATENT DOCUMENTS

| | | | |
|---|---|---|---|
| 9,899,515 B1 | 2/2018 | Cheng et al. | |
| 2006/0199321 A1* | 9/2006 | Lo | H01L 29/458 |
| | | | 438/197 |
| 2018/0012752 A1 | 1/2018 | Tapily | |
| 2018/0166379 A1 | 6/2018 | Yeo et al. | |
| 2018/0331217 A1* | 11/2018 | Chi | H01L 29/1033 |
| 2019/0035691 A1* | 1/2019 | Okuno | H01L 21/823431 |

OTHER PUBLICATIONS

M.H. Park et al., "Selective Atomic Layer Deposition of Titanium Oxide on Patterned Self-Assembled Monolayers Formed by Microcontact Printing," Langmuir, Mar. 16, 2004, pp. 2257-2260, vol. 20, No. 6.

* cited by examiner

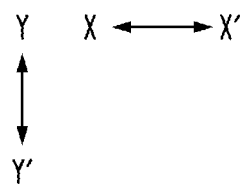
*FIG. 1*
100
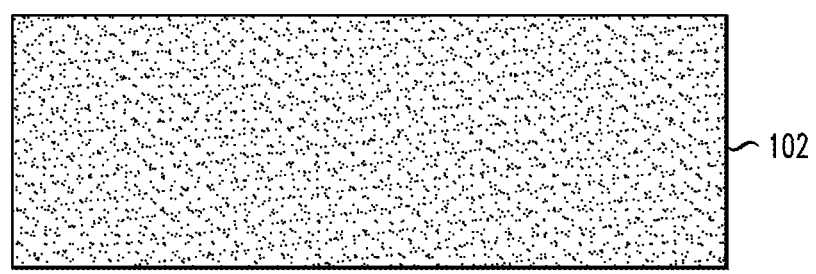
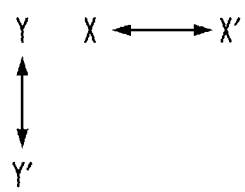
*FIG. 2*
200
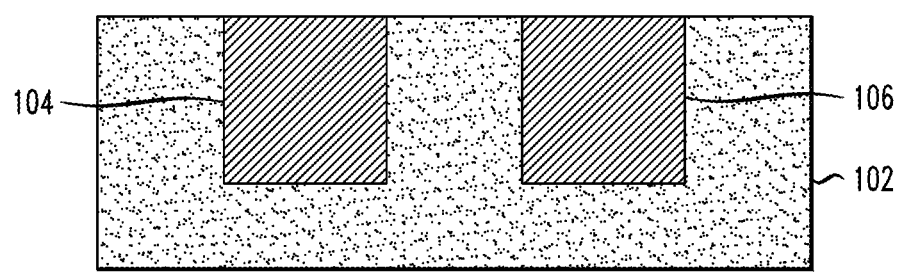

700

800

US 11,063,126 B2

METAL CONTACT ISOLATION FOR SEMICONDUCTOR STRUCTURES

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater number of structural features for a given chip size. Miniaturization, in general, allows for increased performance at lower power levels and lower cost. Present technology is at or approaching atomic level scaling of certain micro-devices such as logic gates, field-effect transistors (FETs), and capacitors. For example, recent development of extreme ultraviolet (EUV) lithography processes using wavelengths such as 13.5 nanometer (nm) are expected to facilitate the accurate patterning of features at sub-10 nm resolution, but there remain significant difficulties in the practical implementation of EUV and similar processes.

SUMMARY

Embodiments of the invention provide techniques for providing electrical isolation between metal contacts in semiconductor structures.

In one embodiment, a method of forming a semiconductor structure comprises the following steps. At least a first source/drain region and a second source/drain region are formed in a substrate. At least a first sacrificial layer and a second sacrificial layer are respectively formed over the first source/drain region and the second source/drain region. A spacer layer is formed on at least a top surface of the substrate and around sides of the first sacrificial layer and the second sacrificial layer. The spacer layer comprises an electrical-isolating material. The first sacrificial layer and a second sacrificial layer are removed to form a first open trench and a second open trench. The first open trench and the second open trench are filled with metal contact material to form a first metal contact and a second metal contact electrically isolated from each other by the spacer layer.

In another embodiment, a semiconductor structure comprises: a substrate; at least a first source/drain region and a second source/drain region disposed in the substrate; a first metal contact and a second metal contact respectively disposed over the first source/drain region and the second source/drain region; and a cut-first spacer layer disposed on at least a top surface of the substrate and around sides of the first metal contact and the second metal contact, wherein the spacer layer electrically isolates the first metal contact and the second metal contact from each other.

In yet another embodiment, an integrated circuit comprises at least one semiconductor structure comprising: a substrate; at least a first source/drain region and a second source/drain region disposed in the substrate; a first metal contact and a second metal contact respectively disposed over the first source/drain region and the second source/drain region; and a cut-first spacer layer disposed on at least a top surface of the substrate and around sides of the first metal contact and the second metal contact, wherein the spacer layer electrically isolates the first metal contact and the second metal contact from each other.

BRIEF DESCRIPTION OF THE DRAWINGS

FIG. 1 depicts a cross-sectional side view of a semiconductor structure following formation of a dielectric substrate, according to an illustrative embodiment.

FIG. 2 depicts a cross-sectional side view of a semiconductor structure following formation of source/drain regions in a dielectric substrate, according to an illustrative embodiment.

DETAILED DESCRIPTION

Figure 3:
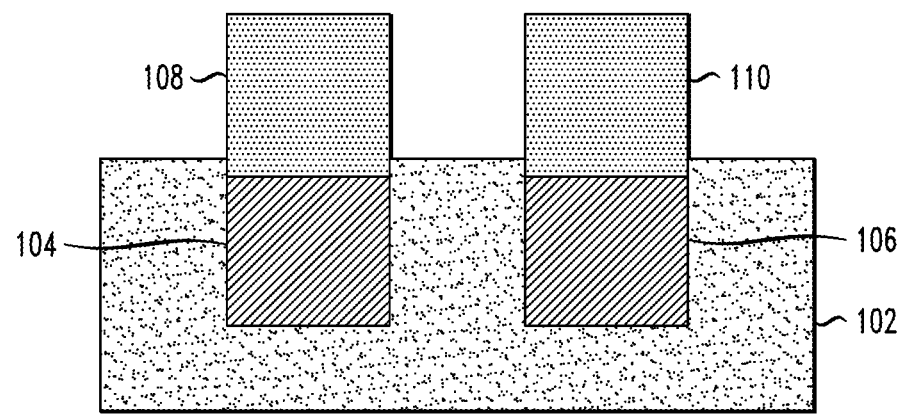
FIG. 3 depicts a cross-sectional side view of a semiconductor structure following growth of metal oxide layers on source/drain regions, according to an illustrative embodiment.

Illustrative embodiments of the invention may be described herein in the context of illustrative methods for providing electrical isolation between metal contacts in semiconductor structures, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

A field-effect transistor (FET) is a transistor having a source, a gate, and a drain, and having action that depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (nFET and pFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

Increasing demand for high density and performance in integrated circuit devices requires development of new structural and design features, including shrinking gate lengths and other reductions in size or scaling of devices. Continued scaling, however, is reaching limits of conventional fabrication techniques.

Vertical transport FETs (VTFETs) are being pursued as viable CMOS architectures for scaling to 7 nanometers (nm) and beyond. VTFETs provide the opportunity for further device scaling compared with other device architectures. For example, in a VTFET structure, the current flow is perpendicular to the supporting wafer (substrate) as compared with parallel current flow in a conventional lateral FET structure. Thus, each VTFET has a top source/drain region and a bottom source drain region which are formed at respective ends of a vertical channel. It is to be understood that the term "source/drain region" as used herein means that a given source/drain region can be either a source region or a drain region, depending on the application or circuit configuration. VTFETs have various potential advantages over other conventional structures such as fin field-effect transistors (FinFETs). Such advantages may include improvements in density, performance, power consumption, and integration.

However, it is realized herein that when using EUV lithography to form semiconductor features, e.g., metal contacts, during a MOL (middle-of-the-line) single exposure process, electrical shorting occurs between adjacent metal contacts when spacing between the metal contacts is about 30 nm wide (e.g., measured tip-to-tip for 300 nm×50 nm adjacent metal contacts or measured side-to-side for 300 nm×300 nm adjacent metal contacts).

Illustrative embodiments overcome the above and other drawbacks by providing electrical isolation between features such as metal contacts in semiconductor structures. For example, one or more embodiments form an electrical-isolating (insulating) spacer layer between adjacent metal contacts in a cut-first manner. In illustrative embodiments, cut-first means forming the electrical-isolating spacer layer before forming the metal contacts.

Illustrative processes for forming a semiconductor structure with electrical isolation between adjacent metal contacts will now be described with respect to FIGS. 1-9.

It is to be understood that the various layers, structures, and regions shown in the figures are schematic illustrations that are not drawn to scale. In addition, for ease of explanation, one or more layers, structures, and regions of a type commonly used to form semiconductor devices or structures may not be explicitly shown in a given figure. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the figures to denote the same or similar features, elements, or structures, and thus, a detailed explanation of the same or similar features, elements, or structures will not be repeated for each of the figures. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

To provide spatial context to the different structural orientations of the semiconductor structures shown throughout the figures, XYZ Cartesian coordinates are shown in each of the figures. The terms "horizontal," or "horizontal direction," or "lateral direction" as used herein denote an X-direction of the Cartesian coordinates shown in the figures, the terms "vertical" or "vertical direction" or "vertical height" as used herein denote a Y-direction of the Cartesian coordinates shown in the figures, and the terms "depth," or "depth direction" as used herein denote a Z-direction of the Cartesian coordinates shown in the figures. It is to be understood that assignment of the X-direction, Y-direction, or Z-direction to any particular direction in the figures is arbitrary.

FIG. 1 depicts a cross-sectional side view 100 of a semiconductor structure following formation of a dielectric substrate 102 as part of a resulting VTFET structure. The cross-sectional view 100 of FIG. 1, along with the cross-sectional views of FIGS. 2-8 described below, are cross-sectional views taken perpendicular to a length of the resulting VTFET structure.

The substrate 102 may be formed of any suitable semiconductor structure, including a bulk semiconductor, a semiconductor-on-insulator (SOI) substrate, etc. The substrate 102 may be formed of various silicon-containing materials including but not limited to silicon (Si), silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc.

The horizontal thickness or width (in direction X-X') and the vertical thickness or height (in direction Y-Y') of the FIG. 1 structure may vary, such as based on the number and orientation (tip-to-tip or side-to-side) of contacts that are to be formed therefrom as described in further detail below. In some embodiments, substrate 102 has a thickness in the range from about 50 micrometers (μm) to about 30 nm.

For clarity of illustration, FIGS. 2-9 are shown and described with respect to forming a semiconductor structure with two metal contacts respectively corresponding to a first top source/drain (TSD) region and a second TSD region of respective VTFETs. In other embodiments, however, more or fewer than two metal contacts may be formed to fabricate more or fewer VTFETs in the resulting VTFET structure. Also, it is to be understood that since the figures illustrate metal contact formation for TSD regions, formation of other parts of the VTFET, i.e., bottom TSD region, vertical fin channel, gate, other metal contacts, etc., are not shown for economy of description. One of ordinary skill in the art will appreciate conventional processes for forming such other parts of a VTFET structure. Also, while electrical-isolation techniques are described herein in the context of illustrative embodiments for forming metal contacts for TSD regions, alternative embodiments apply such electrical-isolation techniques to other metal contacts or features in a VTFET structure or other semiconductor device.

FIG. 2 depicts a cross-sectional side view 200 of a semiconductor structure following formation of source/drain regions 104 and 106 in dielectric substrate 102. In illustrative embodiments, source/drain regions 104 and 106 are epitaxially grown in recesses formed in dielectric substrate 102. The process of forming such recesses via etching is not expressly shown or further described as one of ordinary skill in the art will appreciate conventional processes for forming the recesses.

As illustratively used herein, terms such as "epitaxial growth and/or epitaxial deposition" and "epitaxially formed and/or epitaxially grown" refer to the growth of a semiconductor material on a deposition surface of a semiconductor material.

Examples of various epitaxial growth processes include, but are not limited to, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE).

In illustrative embodiments, each of source/drain regions 104 and 106 can be epitaxially doped regions wherein doping is performed in-situ or ex-situ. The composition of the source/drain regions and the dopants can vary depending on the type of VTFET being formed. By way of example only, for a p-FETs, each of source/drain regions 104 and 106 can include boron-doped SiGe, whereas for n-FETs, each of source/drain regions 104 and 106 can include phosphorous-doped SiC. In some embodiments, each of the source/drain regions 104 and 106 has a thickness in the range from about 20 µm to about 15 nm.

FIG. 3 depicts a cross-sectional side view 300 of a semiconductor structure following growth of metal oxide layers 108 and 110 respectively on source/drain regions 104 and 106. It is to be appreciated that the metal oxide layers 108 and 110 serve as respective sacrificial layers, since they will be removed (FIG. 6) after formation of a spacer layer (FIG. 4) around all sides of the metal oxide layers but before forming metal contacts (FIGS. 7 and 8) as will be explained below.

In illustrative embodiments, metal oxide layers 108 and 110 are formed using area-selective atomic layer deposition (ALD). ALD is used to selectively grow metal oxide material including, but not limited to, aluminum oxide ($Al_2O_3$), hafnium oxide ($HfO_2$), and titanium oxide (TiO or $TiO_2$), as well as variants thereof. It is to be understood that conventional deposition and etching steps are not described in further detail for economy of description. In some embodiments, each of the metal oxide layers 108 and 110 has a thickness in the range from about 5 nm to about 50 nm.

Figure 4:
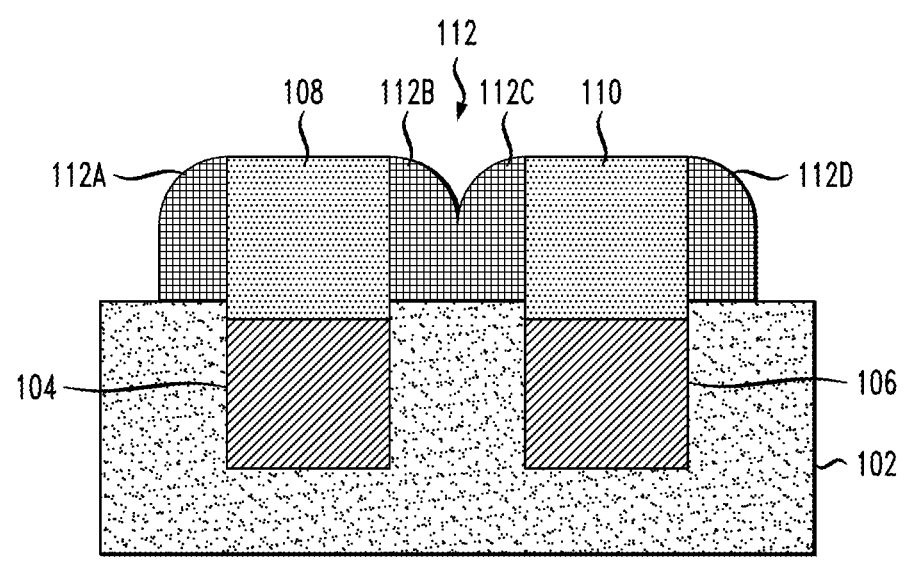
FIG. 4 depicts a cross-sectional side view of a semiconductor structure following formation of a spacer layer around metal oxide layers, according to an illustrative embodiment.

FIG. 4 depicts a cross-sectional side view 400 of a semiconductor structure following formation of a spacer layer 112 around metal oxide layers 108 and 110. In illustrative embodiments, spacer layer 112 is formed by depositing silicon nitride ($Si_3N_4$) or variants thereof (e.g., silicon carbon nitride (SiCN)) on top of dielectric substrate 102 around all exposed sides of the metal oxide layers 108 and 110.

Low pressure chemical vapor deposition (LPCVD) is used to deposit the spacer layer 112 in illustrative embodiments. For example, while spacer layer 112 is a single layer in its final form, spacer regions 112A, 112B, 112C and 112D are formed around each metal oxide layer (108 and 110) with each region having a thickness (in the X-direction as shown in FIG. 4) equivalent to about half the width of the separation between metal oxide layers 108 and 110. That is, assuming a separation of about 24 nm between metal oxide layer 108 and metal oxide layer 110, the thickness of each the spacer regions 112A, 112B, 112C and 112D formed around a given one of the metal oxide layers is about 12 nm. Thus, two adjacent spacer regions 112B and 112C in between the metal oxide layers 108 and 110 fill the entire gap between the metal oxide layers. As mentioned above, however, that the spacer regions 112A, 112B, 112C and 112D form one single spacer layer 112.

In some embodiments, a planarization step is performed to align the top surfaces of the metal oxide layers 108 and 110 with the top surface of the spacer layer 112. It is to be appreciated that the spacer layer 112 will provide the electrical isolation between metal contacts when eventually formed (in FIGS. 7 and 8). In some embodiments, spacer layer 112 has a thickness in the range from about 5 nm to about 50 nm.

Figure 5:
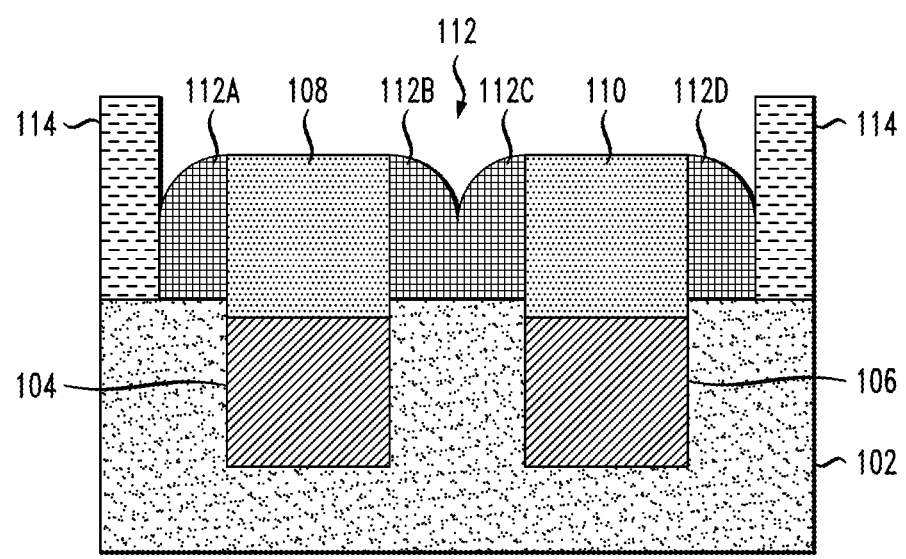
FIG. 5 depicts a cross-sectional side view of a semiconductor structure following formation of a hard mask layer around a spacer layer, according to an illustrative embodiment.

FIG. 5 depicts a cross-sectional side view 500 of a semiconductor structure following formation of a hard mask layer 114 around spacer layer 112. In illustrative embodiments, a hard mask material is formed over the metal oxide layers 108 and 110 and spacer layer 112, and on the exposed top surface of the dielectric substrate 102. The hard mask material is selectively etched to expose the metal oxide layers 108 and 110 and spacer layer 112, as shown in FIG. 5, leaving hard mask layer 114 as a result. In some embodiments, hard mask layer 114 has a thickness in the range from about 10 nm to about 200 nm.

Figure 6:
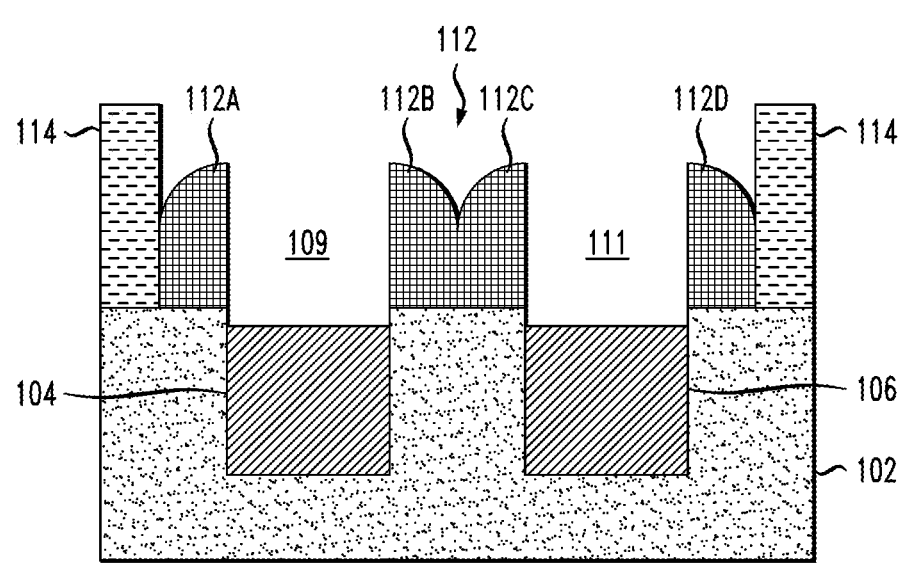
FIG. 6 depicts a cross-sectional side view of a semiconductor structure following removal of metal oxide layers, according to an illustrative embodiment.

FIG. 6 depicts a cross-sectional side view 600 of a semiconductor structure following removal of metal oxide layers 108 and 110. In illustrative embodiments, a dry etching process such as reactive ion etching (ME) is used to remove metal oxide layers 108 and 110. RIE uses chemically reactive plasma to remove deposited material. The plasma is generated under low pressure by an electromagnetic field, and high-energy ions from the plasma attack each metal oxide layer and react with it. After removal of metal oxide layers 108 and 110, open trenches 109 and 111 respectively result.

Figure 7:
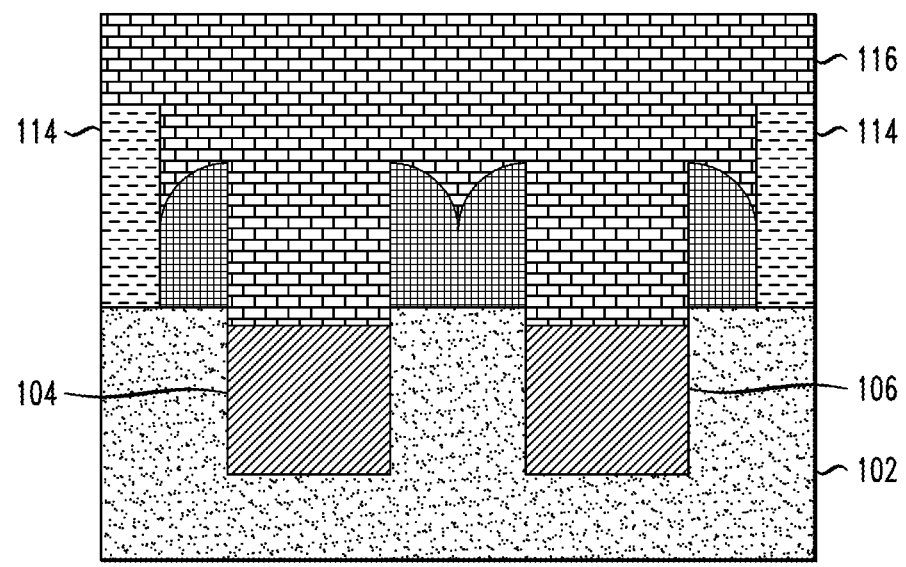
FIG. 7 depicts a cross-sectional side view of a semiconductor structure following formation of metal contact material, according to an illustrative embodiment.

FIG. 7 depicts a cross-sectional side view 700 of a semiconductor structure following formation of metal contact material 116. As shown, trenches 109 and 111, and the open area between and above the hard mask layer 114, are filled with electrically conductive material such as, but not necessarily limited to, tungsten, cobalt, zirconium, tantalum, titanium, aluminum, ruthenium, and/or copper. A liner layer (not shown) including, for example, titanium and/or titanium nitride, may be formed on source/drain regions 104 and 106 and on side and bottom surfaces of the trenches and open areas before filling them with the contact material 116.

The metal contact material fill process can be performed using one or more deposition techniques, including, but not necessarily limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering.

Figure 8:
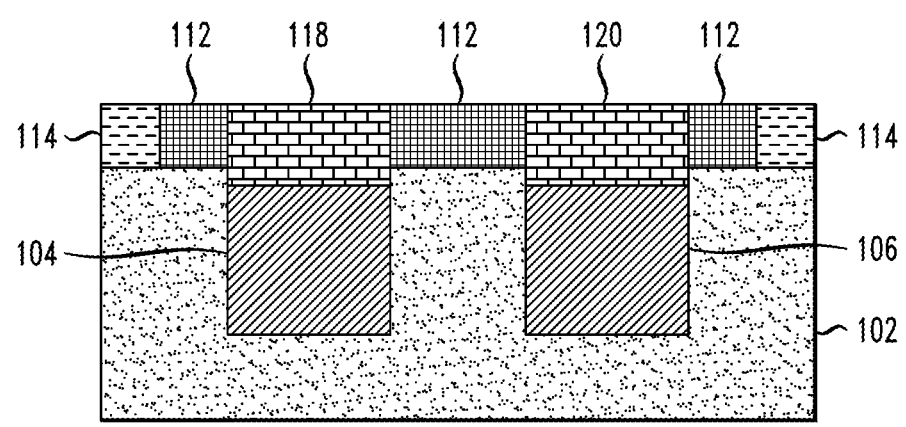
FIG. 8 depicts a cross-sectional side view of a semiconductor structure following planarization of metal contact material, according to an illustrative embodiment.

FIG. 8 depicts a cross-sectional side view 800 of a semiconductor structure following planarization of metal contact material 116 to form metal contacts 118 and 120 respectively over source/drain regions 104 and 106. Illustrative embodiments perform chemical mechanical planarization (CMP) to form the final top surface of the semiconductor structure 100. In some embodiments, each of the metal contacts 118 and 120 has a width in the range from about 10 μm to about 10 nm.

Figures 9, 10:
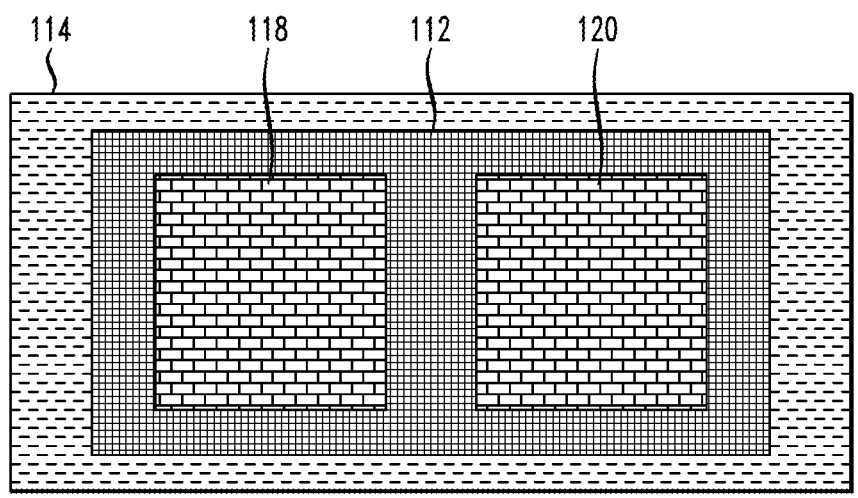
FIG. 9 depicts a cross-sectional top-down view of the semiconductor structure of FIG. 8.
FIG. 10 depicts a block diagram of an integrated circuit with a plurality of semiconductor devices formed according to one or more illustrative embodiments.

FIG. 9 depicts a cross-sectional top-down view 900 of the semiconductor structure of FIG. 8. As can be seen from the top-down view 900, spacer layer 112 surrounds metal contacts 118 and 120, electrically isolating each metal contact from the other.

FIG. 10 depicts an integrated circuit 1000 with a plurality of semiconductor devices 1002-1 through 1002-N formed according to one or more illustrative embodiments. It is to be appreciated that at least two of the semiconductor devices 1002-1 through 1002-N comprise semiconductor structures having metal contacts formed with an electrical-isolating spacer layer therebetween as described above in the context of FIGS. 1-9. For example, in illustrative embodiments, two or more of the plurality of semiconductor devices 1002-1 through 1002-N are VTFET devices.

It is to be appreciated that the various materials, processing methods (e.g., etch types, deposition types, etc.) and dimensions provided in the discussion above are presented by way of example only. Various other suitable materials, processing methods, and dimensions may be used as desired.

Semiconductor devices and methods for forming same in accordance with the above-described techniques can be employed in various applications, hardware, and/or electronic systems. Suitable hardware and systems for implementing embodiments of the invention may include, but are not limited to, sensors and sensing devices, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other high-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure, comprising:
    forming at least a first source/drain region and a second source/drain region in a substrate;
    forming at least a first sacrificial layer and a second sacrificial layer respectively over the first source/drain region and the second source/drain region, the first and second sacrificial layers defining a gap therebetween;
    forming a spacer layer on at least a top surface of the substrate and around sides of the first sacrificial layer and the second sacrificial layer, the spacer layer including a spacer region filling the gap between the first and second sacrificial layers, wherein the spacer layer comprises an electrical-isolating material;
    subsequent to forming the spacer layer, removing the first sacrificial layer and the second sacrificial layer to form a first open trench and a second open trench; and
    filling the first open trench and the second open trench with metal contact material to form a first metal contact and a second metal contact electrically isolated from each other by at least a remaining segment of the spacer region of the spacer layer.

2. The method of claim 1, further comprising:
    forming a hard mask on the substrate and around outer portions of the spacer layer, wherein the hard mask layer defines an open area above the spacer layer, the first sacrificial layer and the second sacrificial layer.

3. The method of claim 2, wherein the filling step further comprises filling the open area defined by the hard mask layer, the first open trench, and the second open trench with the metal contact material.

4. The method of claim 3, further comprising planarizing the metal contact material.

5. The method of claim 1, wherein the first sacrificial layer and the second sacrificial layer each comprise metal oxide material.

6. The method of claim 5, wherein the metal oxide material is deposited using an area-selective atomic layer deposition process.

7. The method of claim 1, wherein the first source/drain region and the second source/drain region are respective top source/drain regions of a pair of vertical transport field effect transistors.

8. The method of claim 1, wherein the first metal contact and the second metal contact are separated by about 30 nanometers or less.

9. The method of claim 1, wherein the spacer layer comprises silicon nitride or variants thereof.

10. The method of claim 1, wherein the first source/drain region and the second source/drain region are epitaxially grown in the substrate.

11. A semiconductor structure, comprising:
    a substrate defining a first axis corresponding to a width of the substrate and a second axis corresponding to a height of the substrate;
    at least a first source/drain region and a second source/drain region disposed in the substrate;
    a first metal contact and a second metal contact respectively disposed over the first source/drain region and the second source/drain region; and
    a cut-first spacer layer disposed on at least a top surface of the substrate and around sides of the first metal contact and the second metal contact and including at least a spacer region extending from the first metal contact to the second metal contact, wherein the spacer layer electrically isolates the first metal contact and the second metal contact from each other;

wherein the spacer region fills a major portion of a gap defined along the first and second axes between the first and second metal contacts.

12. The semiconductor structure of claim 11, further comprising a hard mask disposed on the substrate and around outer portions of the spacer layer.

13. The semiconductor structure of claim 11, wherein the first source/drain region and the second source/drain region are respective top source/drain regions of a pair of vertical transport field effect transistors.

14. The semiconductor structure of claim 11, wherein the first metal contact and the second metal contact are separated by about 30 nanometers or less.

15. The semiconductor structure of claim 11, wherein the spacer layer comprises silicon nitride or variants thereof.

16. The semiconductor structure of claim 11, wherein the first source/drain region and the second source/drain region are epitaxially grown in the substrate.

17. An integrated circuit comprising:
  at least one semiconductor structure comprising: a substrate defining a first axis corresponding to a width of the substrate and a second axis corresponding to a height of the substrate;
  at least a first source/drain region and a second source/drain region disposed in the substrate;
  a first metal contact and a second metal contact respectively disposed over the first source/drain region and the second source/drain region; and
  a cut-first spacer layer disposed on at least a top surface of the substrate and around sides of the first metal contact and the second metal contact and including at least a spacer region extending from the first metal contact to the second metal contact, wherein the spacer layer electrically isolates the first metal contact and the second metal contact from each other;
  wherein the spacer region fills a major portion of a gap defined along the first and second axes between the first and second metal contacts.

18. The integrated circuit of claim 17, wherein the semiconductor structure is part of a pair of vertical transport field effect transistors.

19. The method of claim 1, including subjecting the spacer and the first and second metal contacts to at least one planarization process;
  wherein an upper surface of the spacer region is coterminous with respective upper surfaces of the first and second metal contacts.

20. The semiconductor structure of claim 11, wherein an upper surface of the spacer region is coterminous with respective upper surfaces of the first and second metal contacts.

* * * * *